United States Patent [19]

Matsushita et al.

[11] 3,971,061

[45] July 20, 1976

[54] SEMICONDUCTOR DEVICE WITH A HIGH BREAKDOWN VOLTAGE CHARACTERISTIC

[75] Inventors: Takeshi Matsushita, Sagamihara; Hisao Hayashi; Yoshiyuki Kawana, both of Atsugi, all of Japan

[73] Assignee: Sony Corporation, Tokyo, Japan

[22] Filed: May 15, 1974

[21] Appl. No.: 470,153

[30] Foreign Application Priority Data

May 19, 1973 Japan.............................. 48-55965

[52] U.S. Cl................................... 357/52; 357/20; 357/38; 357/54; 357/58; 357/59; 357/90
[51] Int. Cl.²........................................ H01L 29/34
[58] Field of Search.............. 357/6, 34, 38, 48, 20, 357/52, 54, 58, 59, 90

[56] References Cited
UNITED STATES PATENTS

| | | | |
|---|---|---|---|
| 3,335,296 | 8/1967 | Smart.................................... | 357/38 |
| 3,391,287 | 7/1968 | Kao et al............................... | 357/38 |
| 3,710,204 | 1/1973 | Batz...................................... | 357/53 |
| 3,738,880 | 6/1973 | Laker..................................... | 357/23 |
| 3,911,473 | 10/1975 | Nienhuis............................... | 357/52 |

OTHER PUBLICATIONS

T. Kamins et al., "Diffusion of Impurities in Poly-Si," J. Appl. Phys., vol. 43, No. 1, Jan. 1972, pp. 83-91.
Y. Kao et al., "High-Voltage Planar P-N Junctions," Proc. IEEE, vol. 55, No. 8, Aug. 1967, pp. 1409-1414.

Primary Examiner—Andrew J. James
Assistant Examiner—Joseph E. Clawson, Jr.
Attorney, Agent, or Firm—Hill, Gross, Simpson, Van Santen, Steadman, Chiara & Simpson

[57] ABSTRACT

A semiconductor device is provided having at least two semiconductor regions of opposite conductivity type and forming a planar-type PN junction. A field limiting ring is disposed spaced from the PN junction. A high-resistivity polycrystalline silicon layer covers the PN junction and the field limiting ring.

5 Claims, 9 Drawing Figures

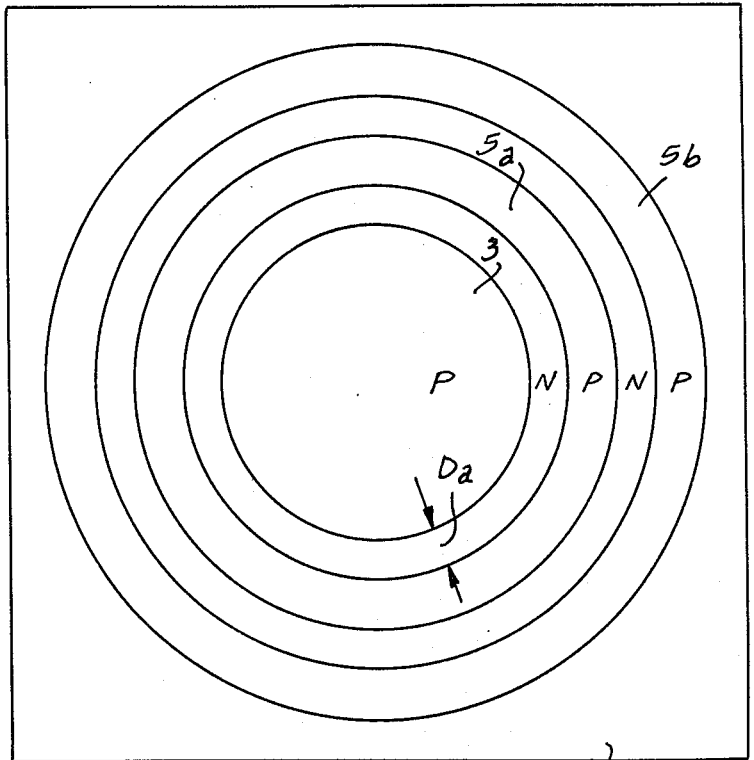
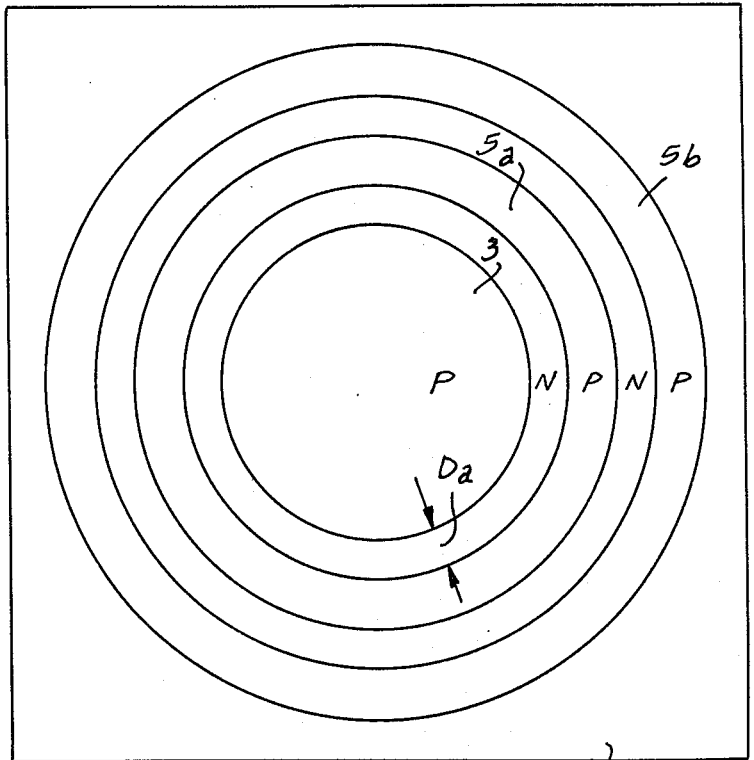
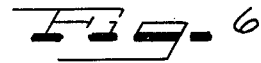
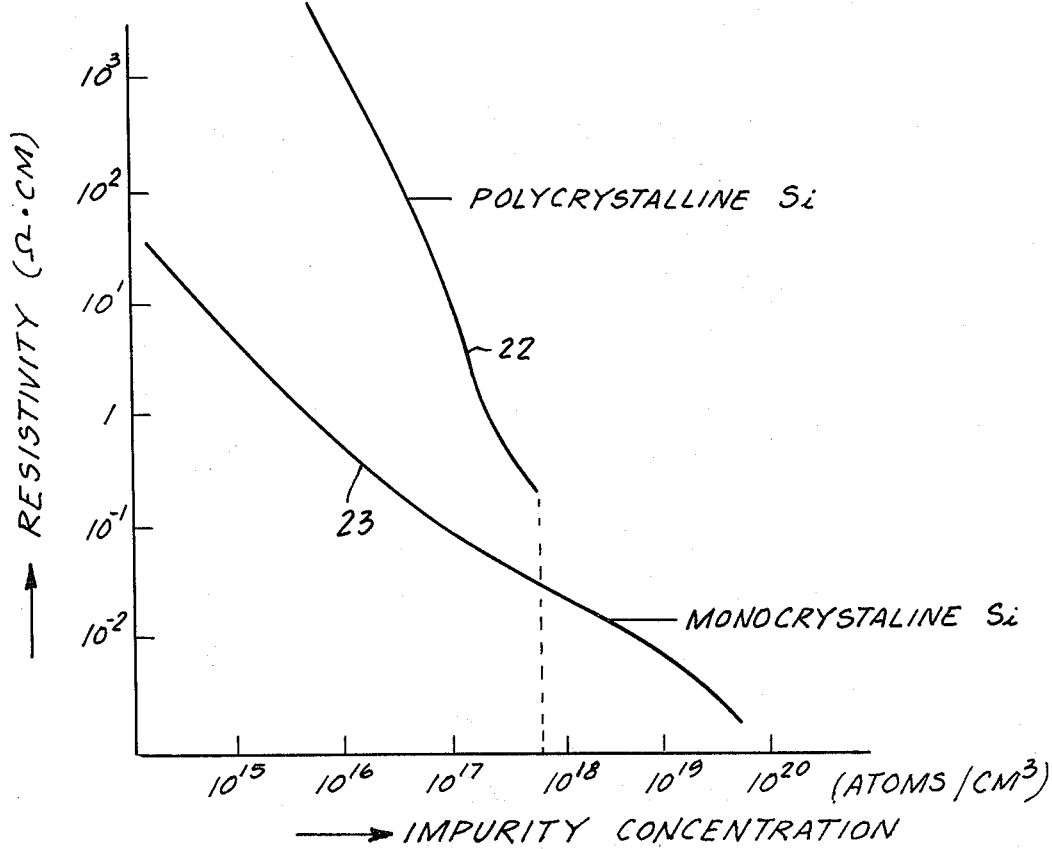

SEMICONDUCTOR DEVICE WITH A HIGH BREAKDOWN VOLTAGE CHARACTERISTIC

BACKGROUND OF THE INVENTION

1. Field of the Invention

This invention relates to a semiconductor device with a high voltage breakdown characteristic, which includes a field limiting ring and a passivation layer.

2. Reference to the Prior Art

As is well known, in a planar transistor, diode, or other semiconductor device, an edge of a junction at the major surface has a certain pronounced curvature, because the PN junction is formed by the selective diffusion method through a window which is opened in the diffusion mask.

The planar device has another characteristic, that is, the end of the PN junction of the device extending to the major surface is covered by a silicon-dioxide ($SiO_2$) layer which has previously been used as the diffusion mask.

When a reverse bias is applied across the PN junction, the voltage of this bias is supported by the depletion region which appears adjacent to the PN junction. When the reverse bias is very high, surface breakdown occurs at the top surface of the device, because the effective width of the depletion layer at the surface becomes smaller than that of the bulk portion.

Such a device having an additional semiconductor ring called a field limiting ring, has been proposed in order to avoid this disadvantage. See for example, U.S. Pat. No. 3,555,373.

In this U.S. patent, the additional semiconductor ring makes a PN junction in the semiconductor body which surrounds the main PN junction of the planar-type diode.

By using this structure, the breakdown voltage characteristic of the device was greatly improved, and this device has obtained a certain degree of commercial success.

The present invention is the improvement of this device.

SUMMARY OF THE INVENTION

The present invention provides a novel planar junction type semiconductor device with one or more field limiting rings and having a high resistivity polycrystalline layer on the surface of the semiconductor device in which the junction type device has been formed.

Another object is to provide an improved semiconductor device having a high voltage breakdown characteristic.

A further object of the invention is to provide a stable passivation layer on a semiconductor device.

Still another object of the invention is to provide a semiconductor device with a high breakdown voltage which has a small pellet size.

BRIEF DESCRIPTION OF THE DRAWINGS

FIG. 5 is a plan view of the device shown in FIG. 4.

FIG. 6 shows the relation between the impurity concentration and the resistivity of the silicon.

DESCRIPTION OF THE PREFERRED EMBODIMENTS

Figure 1:
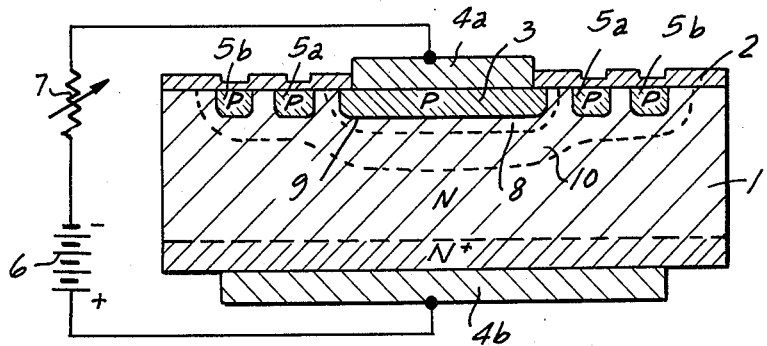
FIG. 1 shows a cross sectional view of a PN diode with field limiting rings of a type known in the prior art.

FIG. 1 shows an example of a prior art planar-type diode having an N-type silicon substrate 1. A silicon dioxide ($SiO_2$) layer 2 is formed on the substrate 1. A P-type region 3 is formed through a hole in the $SiO_2$ layer 2. Two metal electrodes 4b and 4a are deposited on the N-type substrate 1 and on the P-type diffused region 3, respectively. Two P-type additional semiconductor rings 5a and 5b are diffused and formed simultaneously with said P-type region 3. The device is reversed biased with a DC source 6 connected thereto through a variable resistor 7 for varying the voltage across the device.

When the reversed bias is small or low, the depletion layer 8 only appears adjacent the main PN junction 9 and does not reach to the first ring region 5a. When the bias becomes larger, the width of the depletion layer 10 becomes larger and reaches to the first ring 5a and also to the second ring 5b. These two rings 5a and 5b have no electrical contact which engage them and hence they are floating electrically. The distances between the main PN junction 9 and these rings 5a, 5b are selected to have certain values.

Figure 2:
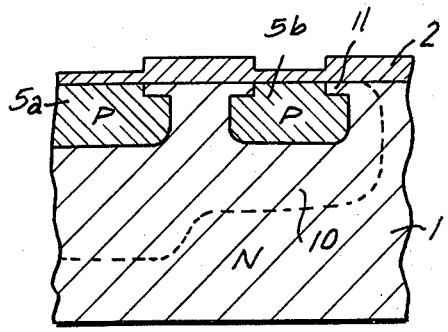
FIGS. 2 and 3 are partially enlarged sectional views of forms of the device exemplified in general by FIG. 1.

By using the so-called planar technique, the major surface of the device is covered by a silicon-dioxide ($SiO_2$) layer 2, which has the surface state $Q_{ss}$ at the interface between the $SiO_2$ layer 2 and the silicone substrate 1. The surface state $Q_{ss}$ causes P-type impurities to appear as an inversion layer 11, and to bend the edge of the depletion layer 10 as shown in FIG. 2. The pronounced curvature makes the breakdown voltage very low.

Figure 3:
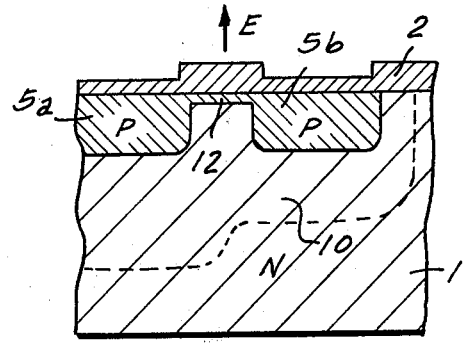

Another disadvantage is apparent from an examination of FIG. 3. When the reversed bias is very high, the electric field E affects the silicon substrate 1. The electric field E is formed between electrodes 4b and 4a, and the field E makes a channel 12 connecting P-type regions. As a result, all ring regions 5a and 5b have the same electric potential, that is, these ring regions cannot hold the floating condition. Then, the benefit of the field limiting rings disappears.

Figure 4:
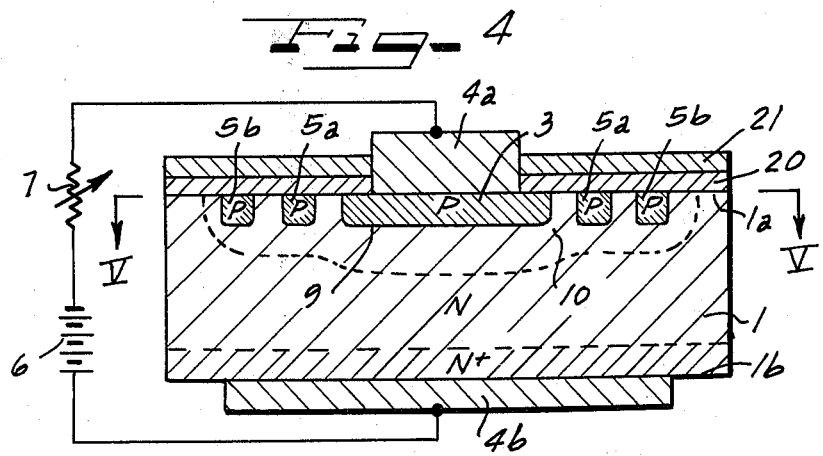
FIG. 4 shows a cross sectional view of one preferred embodiment of the present invention.

FIGS. 4 and 5 show a preferred embodiment of a semi-conductor device of the present invention. FIG. 4 is a cross sectional side view and FIG. 5 is a plan view of the present invention, respectively. The embodiment of the invention as shown in FIGS. 4 and 5 has an N-type silicon substrate 1 having a resistivity about 60 $\Omega$ · cm, a P-type region 3 diffused in one major surface of said substrate 1, having higher impurity concentration than that of said N-type substrate 1 and forming a planar-type PN junction 9. It also has two metal electrodes 4b and 4a deposited on the N-type substrate 1 and on the P-type region 3 respectively. Field limiting rings 5a and 5b of P-type regions are provided which are spaced apart from the PN junction 9 in an electrically floating condition. A double passivating layer comprising a polycrystalline silicon layer 20 and an oxidized silicon layer 21 are formed on one of the major surfaces 1a.

The fabrication process of this device will now be described.

1. An N-type silicon substrate is prepared having a resistivity of 60 Ω · cm, and a thickness of 200 $\mu$. The size of the substrate is 4 × 4 mm$^2$.

2. A heavily doped region (of N+) is diffused in the bottom surface 1b to form an ohmic contact. The surface impurity concentration is selected to be about $10^{20}$ atoms/cm$^3$.

3. P-type regions 3, 5a, and 5b are formed simultaneously by selective diffusion using a silicon-dioxide (SiO$_2$) layer as the diffusion mask (not shown in figures).

4. The mask of SiO$_2$ is etched and removed.

5. A first layer of polycrystalline silicon 20 is deposited by using a chemical vapor deposition (CVD) technique. The thickness of the layer 20 is about 5,000 ~ 10,000 A and the resistivity is $2.5 \times 10^4$ Ω · cm.

6. A second layer 21 of silicon-dioxide (SiO$_2$) is continuously deposited on the first layer 20 of polycrystalline silicon, by changing the vapor of the deposition in a reaction furnace. For example, a mixture gas of monosilane (SiH$_4$) and nitrogen (N$_2$) as a carrier is introduced into the reaction furnace where the silicon substrates are arranged in order to deposit the polycrystalline silicon layer 20. Adding a sufficient amount of steam (H$_2$O) or other oxidation gas into the mixture gas, the silicon-dioxide layer 21 is formed on the surface of the polycrystalline layer 20 without withdrawing the silicon substrate from the reaction furnace.

The thickness of the SiO$_2$ layer 21 is thicker than 1,000 A, for example, about 1,500 A thick.

7. Opening the window in double layer of polycrystalline 20 and the silicon-dioxide (SiO$_2$) 21 with a suitable photo-etching technique, the metal electrode 4a (anode) is deposited on the exposed P-type region 3. The remaining layers of polycrystalline 20 and SiO$_2$ 21 still cover the entire junction and which extends to the one major surface 1a.

8. The bottom electrode 4b (cathode) is formed by depositing metal.

FIG. 6 shows the relation between the impurity concentration (horizontal axis) and the resistivity (vertical axis) of the silicon (Si) comparing the polycrystalline (line 22) with the single crystalline (line 23). The impurity material means, as usual, the material which forms a donor level or an acceptor level in the forbidden gap of the silicon, for example, phosphorus (P), arsenic (As) or antimony (Sb) as the donor impurity, and boron (B) as the acceptor impurity. The arsenic (As) is used in the example of this figure.

When the impurity concentration of the polycrystalline layer is selected lower than $7 \times 10^{17}$ atoms/cm$^3$, the resistivity of the polycrystalline is higher than that of any single crystalline region. It is possible to obtain a resistivity value of $10^6$ Ω · cm using a polycrystalline layer having an impurity concentration of $10^{13}$ atoms/cm$^3$.

In the above-described embodiment, the passivation layers 20 and 21 in FIG. 4 are formed as a pair of layers by changing the reaction atmosphere rather rapidly.

However, when the changing speed is slow, a continuous layer is achieved which has the slant distribution gradually changed of the ratio of doped oxygen to silicon. If the down portion of the layer adjacent the polycrystalline layer has a small or low value of the oxygen ratio, the upper portion is almost silicon-dioxide.

In the first embodiment of the present invention shown in FIGS. 4 and 5 fabricated by the process as described above, the breakdown voltage becomes very high because of the spread of the depletion layer 10 between the main PN junction 9 and a plurality of field limiting rings 5a and 5b. The depletion layer 10 spreads or expands mainly in the N-type substrate 1, because of the less impurity concentration.

The distance Da indicated in FIG. 5 between the edge of the main junction 9 and the facing edge of the first ring 5a is determined such that the depletion layer 10 of the main junction 9 will reach the first ring 5a at a lower applied voltage than the breakdown voltage ($V_B$) of the main junction 9 which is determined by the curvature of the junction or that of the depletion layer and the surface condition of the major surface 1a.

In other words, the distance Da should be smaller than the distance D which is the width of the depletion layer formed by the reversed bias which is almost as high as $V_B$. Here, the Da is 120 $\mu$, for example.

The field limiting rings also have their own thin depletion layer even though the ring region is electrically floating. When the depletion layer of the main junction 9 spreads enough, both depletion layers are connected to each other and form a very wide or expanded depletion layer 10 at the major surface 1a of the device as shown in FIG. 4.

In the present invention, the major surface 1a of the device is covered directly by a polycrystalline silicon layer 20 having very high resistivity. The experimental results of the high resistivity polycrystalline silicon layer shows a higher value in breakdown voltage than that of the conventional SiO$_2$ layer, as exemplified in the table below.

| j(u) | Breakdown voltage (V) | | |
|---|---|---|---|
| | Theoretical value | SiO$_2$ | Polycrystalline |
| 24 | 800 | 550 | 810 |
| 27 | 840 | 600 | 840 |
| 30 | 900 | 550 | 900 |
| 33 | 950 | 550 | 960 |
| 43 | 1060 | 600 | 1040 |

The j indicates the diffused length of the PN junction in microns. The theoretical breakdown voltage is determined from the curvature of the PN junction which is calculated for each j value.

The results of the present invention are better than for a conventional SiO$_2$ layer and, at the same time, is very close to the theoretical value.

The reason why the high breakdown voltage is obtained in the present invention is considered to be that the value of the surface state Qss is negligibly small so that the edge of the depletion is not bent as in the prior art of FIG. 2.

The above table is the result of experiments using the device where a P-type region is diffused into an N-type substrate having resistivity of 60 Ω · cm. The column of "SiO$_2$" shows the results of the device in which the PN junction end is covered by a silicon-dioxide (SiO$_2$) layer and that of "Polycrystalline" shows the result of a device in which the PN junction end is covered by the high resistivity polycrystalline silicon layer having the resistivity of $2.5 \times 10^4$ Ω · cm.

In the present invention, the high resistivity polycrystalline silicon layer 20 is required to cover the entire surface of the PN junction end where the reversed bias should be applied, and also to cover the adjacent area where the depletion layer or region 10 should be spread.

Figure 7:
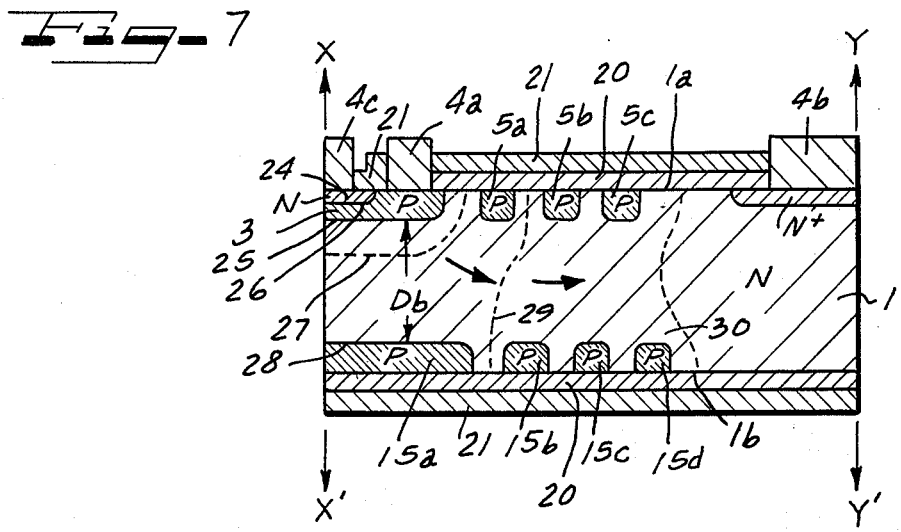
FIGS. 7 and 9 show other embodiments of the invention.

FIG. 7 shows a second embodiment of the present invention, where field limiting rings of opposite conductivity type against the substrate are provided to both major surfaces 1a and 1b, and the high resistivity polycrystalline layers 20 are deposited covering the both major surfaces. Only half of the device is shown in the cross sectional view.

The device shown in FIG. 7 is an NPN transistor comprising an N-type collector region 1, a P-type base region 3, and an N-type emitter region 24. Metal electrodes are provided for each region, namely, the collector electrode 4b, the base electrode 4a, and the emitter electrode 4c.

As is well known, the reversed bias is applied to the collector base junction 25 and the forward bias is applied to the emitter base junction 26, when the transistor is used as an amplifier. So the polycrystalline silicon film 20 is provided so that the layer 20 covers the entire collector base junction 25 and the field limiting rings 5a, 5b, and 5c. The emitter base junction 26 is covered by the $SiO_2$ layer 21.

Adding to the rings 5a, 5b, and 5c of the upper major surface 1a, another set of field limiting region or rings 15a, 15b, 15c, and 15d are provided at the bottom major surface 1b. The bottom rings act also as a field limiting ring when the collector PN junction 25 formed in the substrate 1 is biased reversely. The end surface of the depletion layer 27 expands and spreads in accordance with the reverse bias. The field limiting rings of the bottom surface are electrically floating as that of the upper major surface.

The distance Db between the reversely biased PN junction 25 and the bottom PN junction 28 is selected smaller than the distance D as previously described, for example, Db = 140 $\mu$. According to the applied bias between the base electrode 4a and the collector electrode 4b, the end surface of the depletion layer 27 moves toward the collector electrode 4b as indicated by dotted lines 29 and 30 expanding the depletion region. As a result, the field limiting rings of the second embodiment prevent not only the surface breakdown of the planar junction but also the bulk breakdown. Experimental results show an ultra-high breakdown voltage that is higher than 10,000 volts, using several field limiting rings on both major surfaces covered by high resistivity polycrystalline silicon.

A high voltage transistor is obtained by using the X — X' line in FIG. 7 as a center of the device. In this type, the emitter 24 is surrounded by the collector electrode 4b of a ring type.

Another type is obtained by using the Y — Y' line as a center of the device. In this type, the collector electrode 4b is surrounded by the ring type base 3 and the ring type emitter 24. In this second type, the depletion layer expands toward the center portion of the device. The inward depletion layer of the second type is thicker than the outward depletion layer of the first type.

Figure 8:
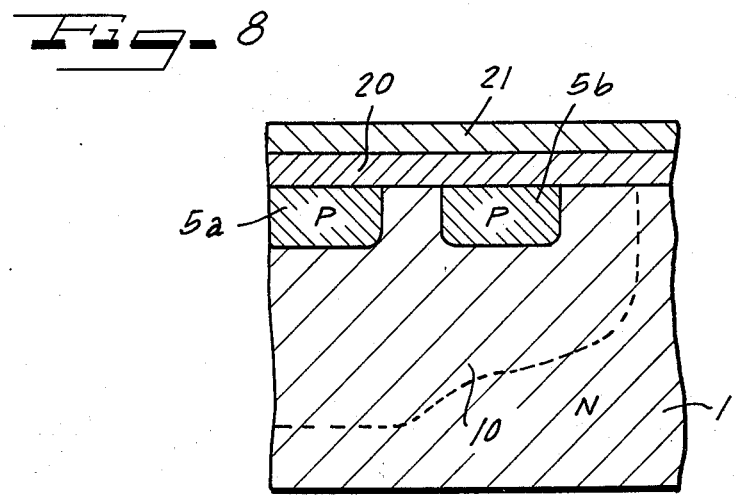
FIG. 8 shows a partially enlarged view of the invention as shown in FIG. 4.

FIG. 8 is a partial enlarged view of a device of the present invention. The depletion layer 10 of the present invention spreads or expands wider than that of the prior art, because the surface state Qss is negligibly small at the interface between the silicon substrate 1 and the passivating polycrystalline layer 20. In other words, if the same breakdown voltage is required, a fewer number of field limiting rings is enough in the present invention. This results in a pellet size smaller than the prior art.

The electric channel explained in FIG. 3 does not appear at the surface of the present invention. The reason is considered to be that the polycrystalline silicon layer 20 is insensitive to the strong electric field. Besides, a mold resin covering the semiconductor device does not have a bad influence on the breakdown voltage of the device, even though the resin is polarized by the field.

Figure 9:
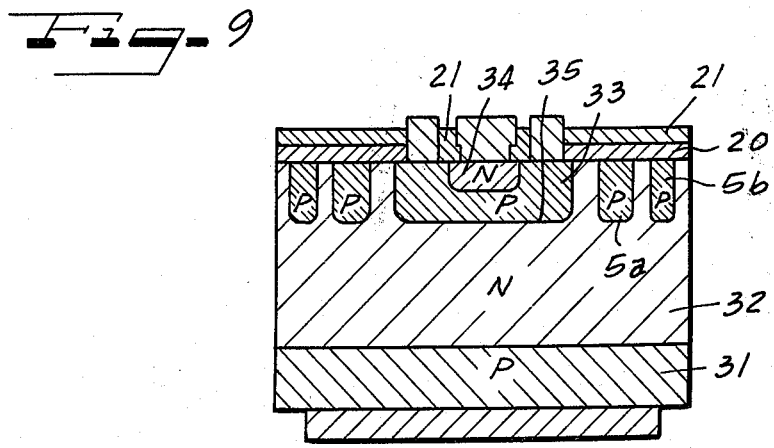

FIG. 9 shows a third embodiment, where the present invention is applied to the thyristor. Four layers of single crystalline silicon are the P-type anode 31, the N-type base 32, the P-type gate 33 and the N-type cathode 34. A plurality of field limiting rings 5a and 5b of P-type are formed surrounding the P-type gate region 33. The high resistivity polycrystalline silicon layer 20 and the silicon-dioxide layer 21 covers the end of the base gas junction 35 and field limiting rings 5a and 5b. The cathode gate junction is covered by the $SiO_2$ layer 21.

In the present invention, the high resistivity of the polycrystalline is preferably higher than $10^4 \Omega \cdot cm$. The polycrystalline silicon film 20 having a resistivity of $10^6 \Omega \cdot cm$ is obtained in the example in which the donor or acceptor impurity concentration is about $10^{13}$ atoms/cm$^3$.

The oxidized silicon layer 21 is required to exist, in order to keep the resistivity of the polycrystalline silicon layer 20 very high.

The concepts of the invention is also used with the opposite conductivity type of the above embodiment.

We claim:

1. A semiconductor device comprising a semiconductor substrate having two major surfaces comprising a first region of one impurity type and a second region of the opposite conductivity type, said first and second regions forming a PN junction therebetween which junction extends to one major surface of said substrate, said PN junction being arranged to be reversely biased by an applied voltage, said substrate including at least one field limiting ring of opposite conductivity type semiconductor material formed therein adjacent said one major surface and spaced from said PN junction by a distance such that the depletion layer of said PN junction is spread to said ring by said voltage, which voltage is less than the breakdown voltage, and a polycrystalline silicon layer covering an entire surface end of said PN junction, the said field limiting ring and an area of said one major surface where said depletion layer spreads, said polycrystalline silicon layer having a resistivity greater than $10^4$ ohms-centimeters, a layer of silicon dioxide overlying said polycrystalline silicon layer, and in which said silicon dioxide layer has a gradually changing oxygen concentration between its top and bottom.

2. A semiconductor device according to claim 1, in which said first semiconductor region has less impurity concentration than that of said second region, said second region having been selectively diffused into said first region.

3. A semiconductor device according to claim 1 in which said first region is N-type silicon having a resistivity of 60 $\Omega \cdot cm$ and in which said second region is P-type silicon of an impurity concentration higher than said first region.

4. A semiconductor device according to claim 1 in which said polycrystalline silicon layer has an impurity concentration of less than $7 \times 10^{17}$ atoms/cm$^3$.

5. A semiconductor device according to claim 1 in which both major surfaces of the device have a plurality of field limiting rings of opposite conductivity type semiconductor material formed therein and said high resistivity polycrystalline silicon layer covering said field limiting rings on said one major surface, and a second high resistivity polycrystalline silicon overlying said second major surface and covering said rings of semiconductor material in said second major surface.

* * * * *